United States Patent [19]

Hofmann et al.

[11] Patent Number: 5,517,856

[45] Date of Patent: May 21, 1996

[54] NMR SAMPLE HOLDER

[75] Inventors: Martin Hofmann, Rheinstetten; Manfred Spraul, Ettlingen, both of Germany

[73] Assignee: Bruker Analytische Messtechnik GmbH, Rheinstetten

[21] Appl. No.: 435,879

[22] Filed: May 5, 1995

[30] Foreign Application Priority Data

May 11, 1994 [DE] Germany .................. 44 16 612.5

[51] Int. Cl.⁶ ................................................ G01R 33/20
[52] U.S. Cl. ............................................................. 324/321
[58] Field of Search ............................... 73/864.91, 863; 324/321

[56] References Cited

U.S. PATENT DOCUMENTS

| | | | |
|---|---|---|---|
| 2,864,995 | 12/1958 | Shoolery | 324/321 |
| 3,038,115 | 6/1962 | Mueller | 324/321 |
| 3,100,866 | 8/1963 | Zimmerman, Jr. et al. | 324/321 |
| 3,548,297 | 12/1970 | Van Geet | 324/321 |
| 3,588,677 | 6/1971 | Kleiman et al. | 324/321 |
| 4,088,944 | 5/1978 | Engler et al. | |
| 4,511,841 | 4/1985 | Bartuska et al. | 324/321 |
| 4,859,949 | 8/1989 | McKenna | 324/321 |
| 5,221,903 | 6/1993 | Kasten et al. | 324/321 |
| 5,247,256 | 9/1993 | Marek | 324/321 |
| 5,260,657 | 11/1993 | Lewis et al. | 324/321 |

FOREIGN PATENT DOCUMENTS

| 1773505 | 8/1973 | Germany | 324/321 |
|---|---|---|---|

OTHER PUBLICATIONS

Descamps et al., "Finger dewar for epr measurement" Cryogenics Dec. 1972, vol. 12, No. 6, pp. 466–467.

Patents Abstracts Of Japan, E–130, Aug. 15, 1979 vol. 3 No. 96.

Wilmad Glass Co., Inc. 1985, Product Catalog pp. 27 and 28.

*Primary Examiner*—Robert Raevis

[57] ABSTRACT

An NMR sample holder comprises:

a rotor 2,3 having a central bore 2e with an internal thread for at least a portion 2g of its length, , a hollow cylindrical sample tube 5 having a closed end and an open end, and having an outer diameter of less than 3 mm, the diameter being such as to enable the sample tube 5 to be accommodated within the central bore 2e in the said rotor, a centring screw 7 having an external thread 7g adapted to engage the said internal thread 2g of the central rotor bore and a central bore 7e adapted to accommodate the sample tube and to centre the sample tube in the central bore of the rotor, and a sealing member 6, 6' which is a sliding fit on the sample tube 5 and adapted to form a seal with an internal surface of the central bore of the rotor and with the sample tube 5.

18 Claims, 4 Drawing Sheets

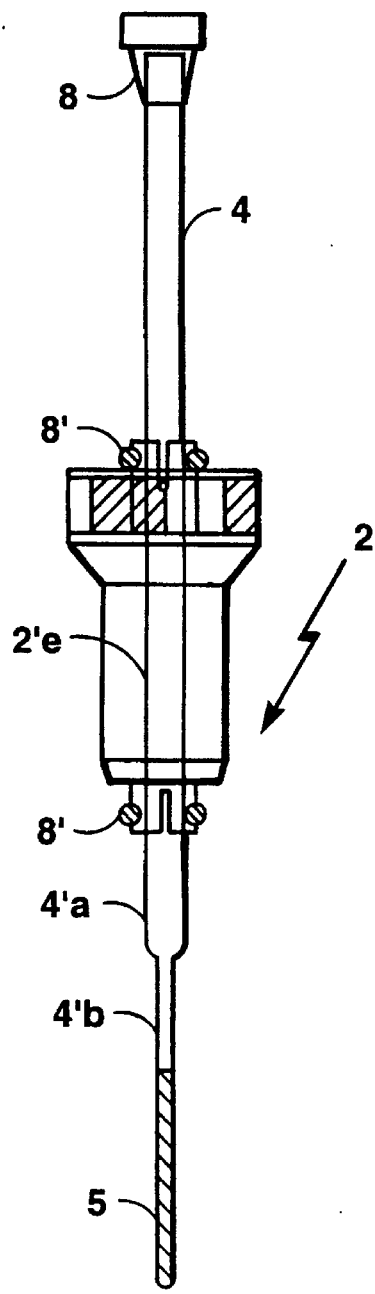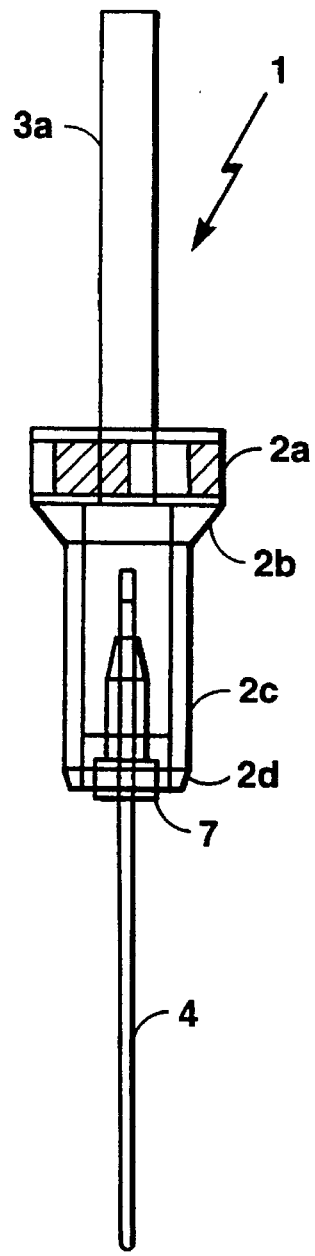
FIGURE 3
(PRIOR ART)
FIGURE 4

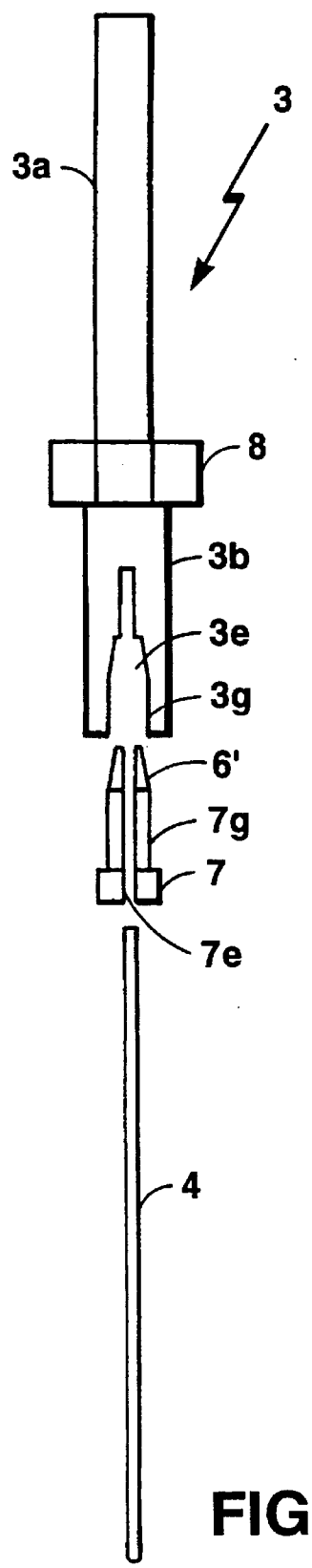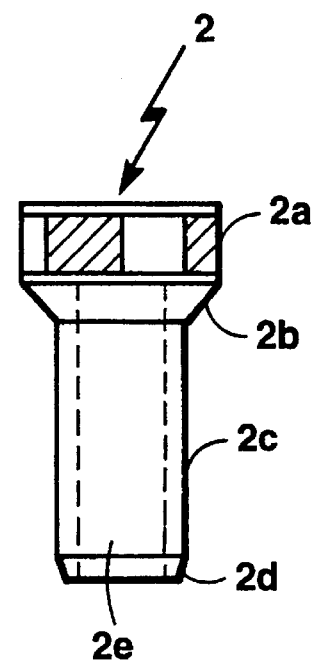
FIGURE 5
FIGURE 6

NMR SAMPLE HOLDER

BACKGROUND OF THE INVENTION

1. Field of the Invention

The invention relates to a sample holder for an NMR spectrometer for use with liquid samples, 2. Description of the Related Art One known type of sample holder for microsamples in the microliter range is produced by the applicant as an accessory to the NMR spectrometers.

This known sample holder uses as a sample holder a glass tube with an outer diameter of about 5 mm which has been drawn to a diameter of only about 2.5 mm at its closed end along a distance of about 40 mm. The entire tube is about 160 mm long. Inside the non-drawn section, the inner diameter is about 4 mm. Usually, a liquid microsample is introduced into this tube with a pipette such that at least a substantial part of the narrowed (lower) section of the tube is filled. Because of the length of the tube, the pipette does not reach its closed (lower) end, so that the sample liquid runs down the inner wall. Because of this, a fraction is adsorbed at the surface, and a fraction evaporates. After filling, the tube is closed by a plug at its open end which is not perfectly gas-tight. After some time, an equilibrium becomes established in the inner volume of the sample tube, where saturated sample vapour lies above the liquid volume in the lower (narrowed) section. Sample vapour may, however, possibly escape slowly past the plug, whereby the sample continues to evaporate. At least during the initial phase, this evaporation is favoured by the large covered surface of the inner wall.

Afterwards, the filled tube is inserted into the central bore of a so-called rotor, whose inner diameter is slightly larger than the outer diameter of the tube, whereby the tube is centred. By means of O-rings slid onto it, the tube is held and its axial position fixed. Generally, the rotor essentially consists of two coaxial cylinders with a common central bore but different outer diameters, which are linked by a conical section. Together with the sample tube, this rotor is lowered vertically from above against a gas stream into the room temperature bore of the cryostat of the superconducting magnet of the NMR spectrometer. The conical section of the rotor either rests on top of a corresponding part of a stator provided inside the probe head of the spectrometer on a gas cushion immediately above said stator or is caused to rotate around its axis (now corresponding to the magnet axis), by means of a gas stream. In this rotor position, the filled part of the sample tube is located just at the central region of the magnet coil and is almost directly surrounded by a high frequency coil to excite and detect NMR signals from the sample.

As far as possible, the sample itself should have the shape of an elongate cylinder, with its ends extending beyond the sensitivity range of the RF coil at both ends, to avoid deterioration of the magnetic field homogeneity because of the susceptibility of the sample. On the other hand, it should fill the sensitivity volume of the RF coil as completely as possible, in order to improve the signal-to-noise ratio. Therefore, up to now, sample holders have been used which are derived from a standard sample holder with a non-tapered tube. These may be used during automatic or semi-automatic spectrometer operation, i.e., with an automatic sample changer, robot manipulator and lowering and ejection of the sample using a computer controlled gas jet. The materials used inside the probe head have to fulfil certain criteria, which are essential for NMR spectrometer operation. Their magnetic susceptibility should be as small as possible, in order not to disturb the field homogeneity inside the measuring volume. Their electrical conductivity should be small, and they should cause few dielectric RF losses. Dependent on the type of nucleus under investigation, they must be free of compounds which could cause interfering NMR signals, i.e., generally free of protons and $^{13}$C. Materials often used are glass, quartz and PTFE.

In addition, glass sample tubes have been used with a uniformly small cross section, the opening of the tube being fused after introducing the sample. These tubes are manually installed into the probe head of an NMR spectrometer and again removed manually after the measurement. Using these prior art tubes, sample changing is difficult, and automatic sample changing is impossible.

The applicant's prior art sample holder referred to above, shows deficiencies some of which have been addressed by the uniform cross-section tube. The tube with cross section reduction is costly to produce. Centring is basically worse than with a simple tube. In addition, there is a risk that in the narrowed section the wall thickness is not constant. All these errors directly, and very often disastrously, influence the field homogeneity and therefore the resolution of the spectrometer. The quite large inner volume in combination with a potential leak at the sealing plug reduces the sample amount by evaporation. However, often only one small sample is available for analysis.

FIG. 3 shows a prior art NMR sample holder for microsamples. Rotor 2' has the same dimensions as rotor 2 in FIGS. 1 and 2. The central bore 2'e has a constant cross section which is slightly larger than the outer diameter of the upper section of sample tube 4'. This sample tube 4' has approximately the same total length as the sample tube 4 plus handling member 3 in FIG. 1, i.e., about 180 mm. Its upper section 4' has a diameter of about 5 mm. In the lower section 4'b this is reduced to about 2.5 mm for a length of about 45 mm. The sample liquid 5 occupies a part of this section 4'b. On top there is a rather large vapour-filled inner volume which can be sealed at the open upper end with a plastic or rubber plug 9'. One or more sliding O-rings 8' effect a bearing and axial alignment of sample tube 4' by each compressing a slotted axial extension of the rotor and thereby locally reducing bore 2e to the outer diameter of tube 4'a.

SUMMARY OF THE INVENTION

According to the invention, there is provided a sample holder for an NMR spectrometer for liquid samples in the microliter range comprising:

a rotor having a central blind bore with a internal thread for at least a portion of its length, a hollow cylindrical sample tube having a closed end and an open end, and having an outer diameter of less than 3 mm, the diameter being such as to enable the sample tube to be accommodated within the central blind bore in the said rotor, a centring screw having an external thread adapted to engage the said internal thread of the central rotor bore and a central bore adapted to accommodate the sample tube and to centre the sample tube in the central bore of the rotor, and a sealing member which is a sliding fit on the sample tube and adapted to form a seal with an internal surface of the central bore of the rotor and with the sample tube, and thereby seal the inner volume of the sample tube in a gas-tight manner, on tightening of the said centring screw, wherein at least prior to tightening of the centring screw, the axial position of the sample tube in the rotor can be adjusted by sliding the sample tube axially in the sample tube. In accordance with a specific aspect of the invention, there is provided a sample holder for an NMR spectrometer for liquid samples in the microliter range, comprising:

a) a rotationally symmetrical rotor having a central bore with a first inside thread at one end of the central bore and a second inside thread at the other;

b) an essentially cylindrical handling member which can be inserted into the central bore of the rotor from one side and screwed to the first inside thread by means of an outside thread, wherein the handling member comprises a central blind bore at its inserted end;

c) a hollow cylindrical glass or quartz sample tube with one closed end and one open end having a constant outer diameter along its length of less than 3 mm which is slightly less than that of the central blind bore of the handling member, so that the open end of the tube can be inserted into the blind bore of the handling member;

d) a hollow screw whose outside thread fits the inside thread of the central rotor bore, with a central bore which is slightly larger than the outer diameter of the sample tube, so that the hollow screw can be slid over the sample tube, the sample tube can be inserted into the pocket bore of the handling member via the inner rotor bore and the outside thread of the hollow screw can be screwed to the second inside thread of the rotor, whereby tube is centred;

e) sealing means slid onto the sample tube which seals the handling member end surface with respect to the hollow screw and the outside of the sample tube and which therefore seals the inner volume of the sample tube in a gas-tight manner, and which also fixes the sample tube axially of the hollow screw after screwing whereby prior to the screwing in, the axial position of the sample tube can be adjusted in the blind bore.

The sample tube employed in the device of the invention is considerably easier to produce than the cross-section reduction, referred to above. The wall thickness tolerances and deviation from axial alignment are decisively less than for a tube with two axial sections of different diameter. The inner volume of the tube is noticeably smaller, reducing the gas volume on top of the liquid sample, so that less sample substance evaporates. Less sample liquid can be adsorbed at the smaller inner wall surfaces. The rotor may preferably include an upwardly-directed projection (referred to herein as a "handling member") to facilitate the handling of the sample tube by automated sample changing devices and the like. A blind bore is preferably provided in the rotor, preferably in the handling member, although in a lower part of the rotor, to accommodate the sample tube. By this means, the length of the sample tube can be reduced, as compared with the prior art device with two axial sections of different diameters, enabling filling by means of an injection needle which almost reaches the closed end. The sample tube may be centred by insertion into the said blind bore. Since the insertion depth is within limits variable, it remains axially adjustable.

The sealing problems are solved by the sealing means slid onto the tube. After the centring screw has been tightened, the entire sample holder may safely be gripped at the handling member or lower part of the rotor. It may be used without any further modification in NMR spectrometers instead of the standard sample holders for standard samples, including fully automatic operation.

In a preferred embodiment of the invention, a lower part of the rotor comprises two essentially cylindrical axial sections of different outer diameters which are linked by a cone shaped section the said internal thread being located at the axial section with the larger outer diameter.

This has the advantage that the cone shaped section rests inside the NMR probe head on a correspondingly shaped stator, or can rotate on top at close distance driven by gas. Correspondingly shaped rotors are standard in the spectrometers of the applicant.

The two cylindrical sections of the lower rotor part preferably have outer diameters of about 25 mm and about 17 mm, respectively. This corresponds to standard dimensions of conventional rotors.

The sample tube preferably has an inner diameter of about 1–1.2 mm. For a representative microsample amount of 25–30 μl this leads to a filling height of about 20 mm, which is sufficient to exceed the axial sensitivity range of the RF coil to such an extent that interferences by the sample susceptibility itself become uncritical.

The central bore of the centring screw may preferably have a cone shaped extension and the sealing means may consist of a sealing ring with a cylindrical section and a conical one, which is pressed into the cone shaped extension when the centring screw is tightened. This has the advantage that the sample volume is safely sealed and that the sealing means fix the sample tube in a defined axial position which can be predetermined.

The sample tube may preferably have an axial length of from 80 mm to 120 mm. This has the advantage that it can easily be filled by means of an injection needle and guarantees a sufficient distance between the RF coil and the rotor, so that magnetic interferences by these components remain small.

More preferably, the handling member has a total length of from 70 mm to 110 mm. This has the advantage that it can be handled easily, both manually and by automatic means.

The handling member preferably has a diameter of from 6 mm to 10 mm, preferably about 8 mm, in its section facing away from the pocket bore. This has the advantage that it can be handled easily, both manually and by automatic means, and corresponds to the standard dimensions of conventional sample tubes.

The handling member may be secured to a lower part of the rotor by means of a screw threaded engagement on the handling member and on the said lower part of the rotor.

In an alternative embodiment, the handling member is an interference fit, or is glued into the lower rotor part, or the lower rotor part and the handling member form a unitary component, in which a central bore in a lower part of the rotor extends into a blind or "pocket" bore in the handling member.

This embodiment does not have the greater flexibility of an easily exchangeable handling member, but nevertheless is a possible variant falling within the scope of the invention.

The rotor, (including the handling member) and/or the hollow centring screw are preferably made from proton-poor plastics, for example PTFE. This has the advantage that the NMR measurement is disturbed only to a low degree.

In use of a sample holder according the preferred embodiment of the invention, as will be described in more detail hereinafter, 1) a liquid microsample is filled into the sample tube up to the desired filling height;

2) the sealing means and the hollow screw are slid over the sample tube;

3) the handling member is screwed from above into the central bore of the lower rotor part;

4) the sample tube is inserted from below into the pocket bore of the handling member up to a given position and the hollow screw is screwed into the central rotor bore from below.

If the handling member and rotor, as described above are not screwed together, but are otherwise attached to each other, e.g., glued or form an integral part, step 3) may be omitted.

BRIEF DESCRIPTION OF THE DRAWINGS

A preferred embodiment of the invention will now be described with reference to the accompanying drawings, in which:

FIG. 3 shows a prior art sample holder; and

FIGS. 4, 5, and 6 show alternative embodiments of the invention.

DETAILED DESCRIPTION OF THE PREFERRED EMBODIMENTS

Figure 1:
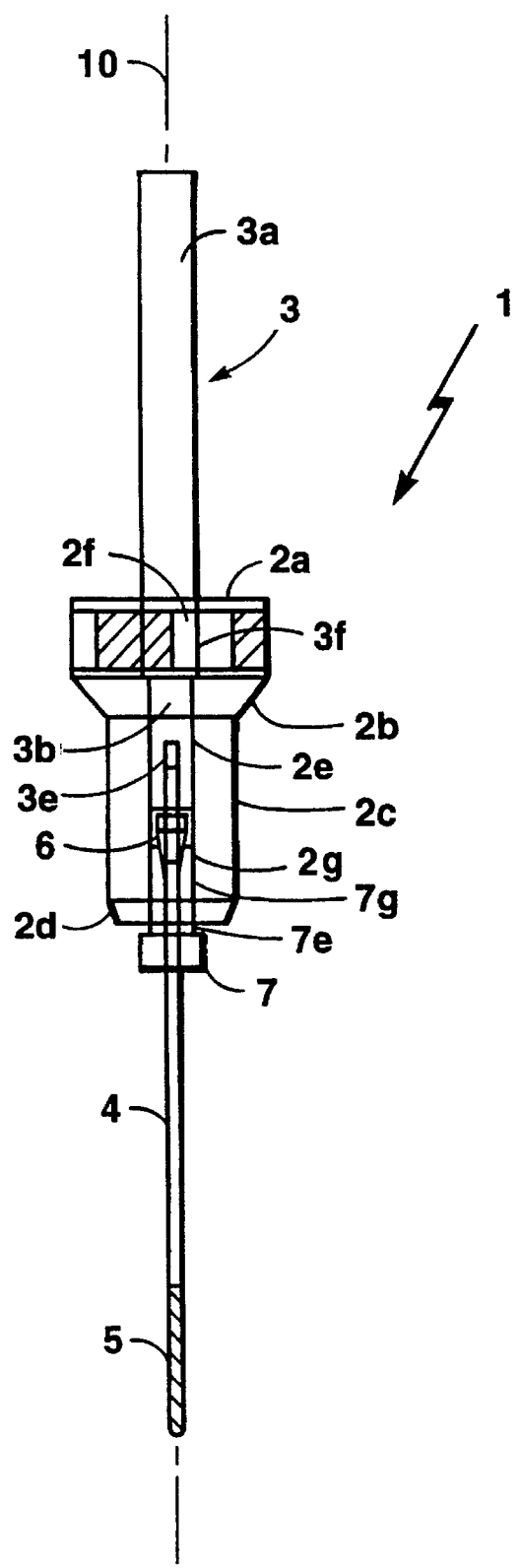
FIG. 1 shows a sample holder according to the invention.
Figure 2:
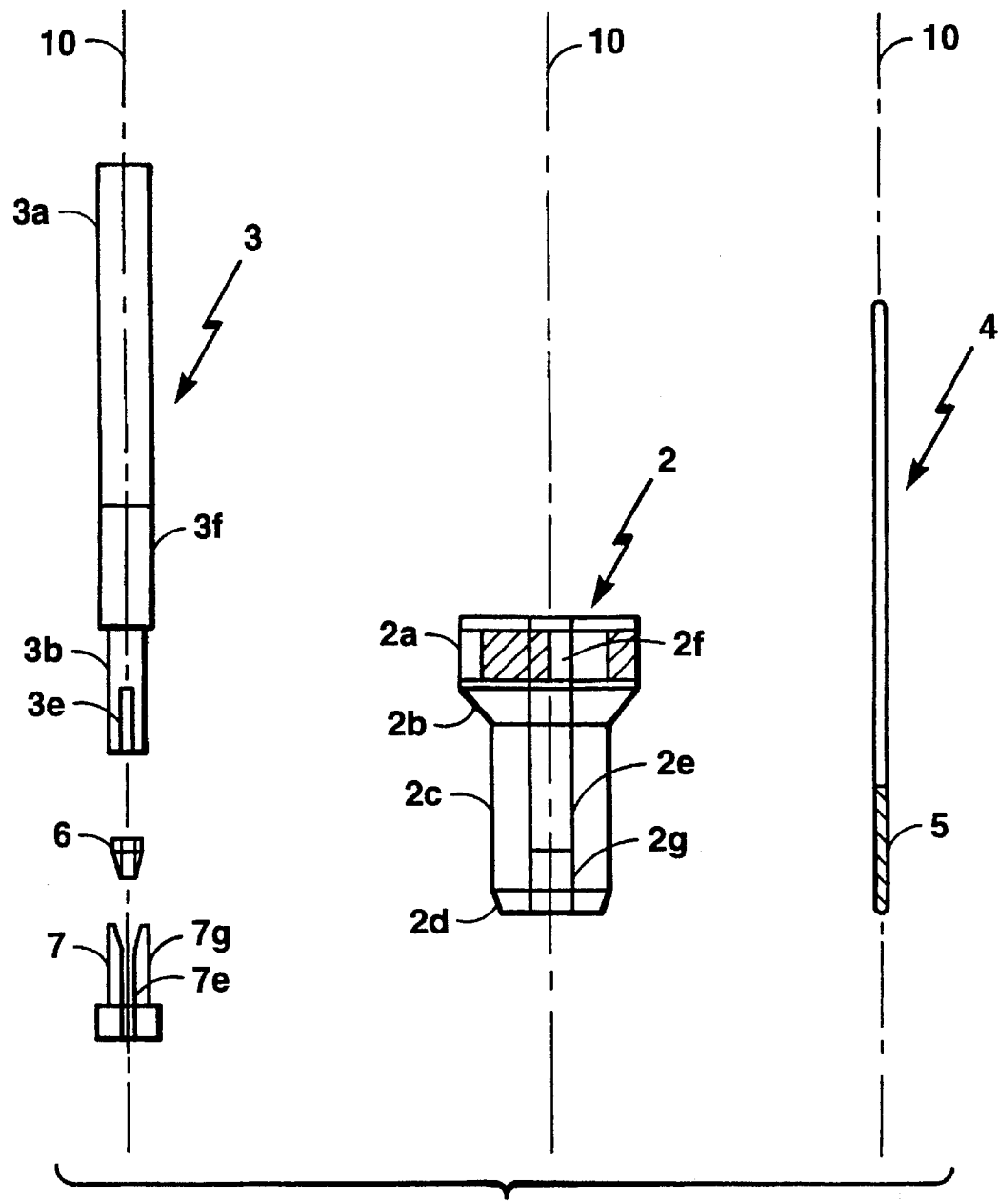
FIG. 2 is a detail view of the components of the sample holder of FIG. 1.

FIGS. 1 and 2 show an embodiment of an NMR sample holder 1 for microsamples according to the invention. A rotor consists of a lower part 2 and an upper handling member 3 both parts 3 and 2 are rotationally symmetrical about axis 10. Lower part 2 has a central bore 2e of diameter 5 mm, central bore 2e has at each end a respective internal thread 2f, 2g. Lower part 2 has an upper section 2a approximately 10 mm in length with an outer diameter of 26 mm, an upper cone shaped section 2b approximately 5 mm in length, a lower cylindrical section 2c approximately 27 mm in length with an outer diameter of 17 mm, and a lower cone shaped section 2d approximately 3 mm length.

During operation, the vertical rotor axis 10 coincides with the vertical symmetry axis of the room temperature bore of the NMR spectrometer cryostat, which in turn is identical to the symmetry axis of the superconducting magnet coil.

Handling member 3 is essentially cylindrical and is screwed into the central bore 2e of lower rotor part 2 from above. This handling member 3 has a total length of 90 mm. In the 60 mm long section 3a, extending from the rotor part 2, it is 8 mm thick with circular cross section, which is advantageous but not compulsory. It can also be hollow. Along a following length of 10 mm, it bears an outside thread 3f, fitting inside thread 2f. In alternative embodiments, lower rotor part 2 and handling member 3 may be plugged or alternative embodiments, lower rotor part 2 and handling member 3 may be plugged or glued together or form a single component. Thread 3f is followed by a 20 mm long cylindrical end section 3b which fits exactly bore 2e of lower rotor part 2 and has a diameter of almost 5 mm. The front face of end section 3b has a central blind or "pocket" bore 3e 10 mm long and with a diameter of about 2 mm.

Sample tube 4 has a length of 100 mm and a constant outer diameter of about 1.6 mm is partly inserted into the blind pocket bore 3e. The lower section of the inner volume of sample tube 4 is filled with the sample liquid 5 up to a length of about 20 mm.

An elastic sealing ring 6 with an outer diameter of about 4.5 mm and tapered at its lower section, is slid over sample tube 4.

Also slid over sample tube 4 is a 17 mm long hollow centring screw 7 with an outside thread 7g which engages the inside thread 2g of the rotor. Screw 7 comprises a central bore 7e with an outer diameter of about 2 mm, through which the sample tube 4 is slid. The bore is enlarged at the upper end of screw 7 end, in a conical fashion to produce a sealing ring 6, such that when screw 7 is tightened, the sealing ring closely fits the inner wall of the conical enlargement of the hollow screw 7 bore, the outer wall of sample tube 4 as well as the front face of the end section 3b of handling member 3 in a gas-tight way and forms a seal. Thereby it seals the inner volume of sample tube 4, i.e., the vapour volume on top of the sample liquid 5 with respect to the outside. The vapour-filled volume is restricted to the section of the narrow sample tube 4 and the part of the bore 3e which is not occupied by the upper section of the sample tube. By more or less deep insertion of sample tube 4 into bore 3e, the axial position of the sample tube may still be adjusted within the limit of the bore 3e depth.

FIG. 2 shows the essential components of FIG. 1 separately. The reference numerals of corresponding components are the same.

An alternative embodiment of the invention is illustrated in FIGS. 4, 5 and 6, in which like reference numbers are used to identify like parts as in FIGS. 1 and 2. In FIGS. 4, 5 and 6, a rotor comprises a lower part 2 (a "sample spinner") and an upper "handling member" 3. Lower part or sample spinner 2 has a simple central bore 2e of just over 10 mm diameter without any internal thread. Such sample spinners are available as standard parts for large conventional 10 mm sample tubes.

Handling member 3 has an upper section 3a 8 mm in diameter and a lower section 3b 10 mm in diameter. There is no outside thread on handling member 3. Lower section 3b has an axial blind bore 3e having an inside thread 3g followed by a conical section and a small diameter section of just over 2.5 mm in diameter.

Hollow centring screw 7 has an outside thread 7g fitting inside thread 3g and a cone shaped sealing extension 6' fitting the conical section of blind bore 3e. The central bore 7e of screw 7 has a diameter just larger than that of a microsample tube 4, which might be e.g., 1.7 mm or 2.0 mm or 2.5 mm.

Sample spinner 2 and microsample tubes 4 for various outer diameters are available "off the shelf" as accessories for NMR spectrometers. Hollow screws suitable for use as screw 7 of various bore diameter, and including the conical sealing are also commercially available, as accessories for high pressure liquid chromatography apparatus.

Part 3, the "handling member" has to be manufactured. However, a single size can then be used for microsample tubes of different diameters.

After filling, microsample tube 4 is inserted into the bore 7e of hollow screw 7 and this is screwed into inside thread 3g of blind bore 3e of rotor part 3. Conical extension 6' is pressed against the conical part of the bore 3e and ensures a gas-tight fitting. The assembly including handling member 3, hollow screw 7 and microsample tube is inserted into the bore of spinner 2. In fact, it is treated just like a conventional 10 mm sample tube i.e., it is not screwed in place but is just a tight sliding fit and is secured in place with an O-ring (see 8' of FIG. 3).

In the embodiment shown in FIG. 4, in contrast to the embodiment of FIGS. 1 and 2, hollow screw 7 and sealing means 6' form one integral component. Hollow screw 7 is not screwed to the lower part 2 of the rotor, by its external thread 7g but to the inner thread 3g of blind bore 3e of handling member 3. The sealing cone 6' is pressed into a cone shaped tapered section of pocket bore 3e. As before, sample tube 4 is slid into the central bore 7e of hollow screw 7 prior to tightening which serves to centre it and maintain a gas-tight seal. More or less deep insertion through bore 7e of hollow screw 7 into the narrow continuation of bore 3e ensures axial adjustment. After screw 7 has been tightened, handling member 3 and tube 4 form an integral part that can be handled just like a standard sample tube with a diameter of the upper section 3a of the handling member 3, generally 8 mm. It can be inserted as a whole into sample spinner 2 and fixed just like a standard tube of constant outer diameter, e.g., by means of an O-ring as sketched in FIG. 3 by reference number 8'. In order to ensure sufficient wall thickness of hollow screw 7 and handling member 3, the bore 2e has a diameter of preferably about 10 mm which is a standard size for large sample tubes. However, in contrast to the rotor of FIGS. 1 and 2, bore 2e has a constant diameter without any inside thread (as standard rotor 2 of FIG. 3). In this way, largely inexpensive standard components can be used. Only handling member 3 has to be manufactured to special microsample specifications, since hollow screws, even with an integrated cone shaped sealing member, can be obtained as standard parts, e.g., as fittings for high-pressure liquid chromatography applications.

The various features described above may be used alone, or several of them in any combination without departing from the scope of the invention, as defined by the appended claims, and the embodiments specifically described are intended to be merely examples of the possible specific constructions within the scope of the present invention. At least the preferred embodiments of the invention are capable of providing a better filling factor, being less susceptible to centring errors and wall thickness fluctuations and with less liquid sample evaporation possibility, than the devices according to the prior art.

What is claimed is:

1. A sample holder for an NMR spectrometer for liquid samples in the microliter range comprising:

a rotor having a central blind bore with a internal thread for at least a portion of its length, a hollow cylindrical sample tube having a closed end and an open end, and having an outer diameter of less than 3 mm, the diameter being such as to enable the sample tube to be accommodated within the central blind bore in the said rotor, a centring screw having an external thread adapted to engage the said internal thread of the central rotor bore and a central bore adapted to accommodate the sample tube and to centre the sample tube in the central bore of the rotor, and a sealing member which is a sliding fit on the sample tube and adapted to form a seal with an internal surface of the central bore of the rotor and with the sample tube, and thereby seal the inner volume of the sample tube in a gas-tight manner, on tightening of the said centring screw, wherein at least prior to tightening of the centring screw, the axial position of the sample tube in the rotor can be adjusted by sliding the sample tube axially in the centring screw.

2. A sample holder as claimed in claim 1, wherein the rotor comprises an upwardly directed handling member.

3. A sample holder as claimed in claim 2, wherein the handling member is secured to a lower part of the rotor by means of a screw threaded engagement on the handling member and on the said lower part of the rotor.

4. A sample holder as claimed in claim 3, wherein the said internal thread formed on the central bore of the rotor adapted to engage the centring screw is formed in the said lower part of the rotor.

5. A sample holder as claimed in claim 2, wherein the handling member has a length of from 70 mm to 110 mm.

6. A sample holder as claimed in claim 2, wherein the handling member has an outer diameter of from 5 mm to 10 mm.

7. A sample holder as claimed in claim 1, wherein the sealing member is integral with the centring screw.

8. A sample holder as claimed in claim 1, wherein the sealing member consists of a resilient sealing ring having a conical surface, and wherein the rotor bore or the centring screw has a conical sealing surface adapted to engage the said conical surface of the sealing ring.

9. A sample holder as claimed in claim 1, wherein the rotor comprises two essentially cylindrical axial sections of different outer diameters joined by a downwardly tapering cone shaped section.

10. A sample holder as claimed in claim 9, wherein the two said cylindrical sections of the rotor have outer diameters of about 25 mm and about 17 mm, respectively.

11. A sample holder as claimed in claim 1, wherein the sample tube has a length of from 80 mm and 120 mm.

12. A sample holder as claimed in claim 1 wherein the sample tube has an internal diameter of about 1 mm.

13. A sample holder as claimed in claim 1, wherein one or more of the rotor, sealing member and the centring screw are made of a substantially proton-free material.

14. A sample holder as claimed in claim 1, wherein the rotor is rotationally symmetrical.

15. A sample holder as claimed in claim 1, having a plurality of sample tubes of differing external diameter and a corresponding plurality of centring screws with corresponding central bores.

16. A sample holder for an NMR spectrometer for liquid samples in the microliter range, comprising:

a) a rotationally symmetrical rotor having a central bore with a first inside thread at one end of the central bore and a second inside thread at the other;

b) an essentially cylindrical handling member which can be inserted into the central bore of the rotor from one side and screwed to the first inside thread by means of an outside thread, wherein the handling member comprises a central blind bore at its inserted end;

c) a hollow cylindrical glass or quartz sample tube with one closed end and one open end having a constant outer diameter along its length of less than 3 mm which is slightly less than that of the central blind bore of the handling member, so that the open end of the tube can be inserted into the blind bore of the handling member;

d) a hollow screw whose outside thread fits the second inside thread of the central rotor bore, with a central bore which is slightly larger than the outer diameter of the sample tube, so that the hollow screw can be slid over the sample tube, the sample tube can be inserted into the blind bore of the handling member via the inner rotor bore and the outside thread of the hollow screw can be screwed to the second inside thread of the rotor, whereby the tube is centred;

e) sealing means slid onto the sample tube which seals the handling member end surface with respect to the hollow screw and the outside of the sample tube and which therefore seals the inner volume of the sample tube in a gas-tight manner, and which also fixes the sample tube axially of the hollow screw after screwing whereby prior to the screwing in, the axial position of the sample tube can be adjusted in the blind bore.

17. A Method of preparing an NMR sample which method comprises a) introducing a liquid microsample into a hollow cylindrical sample tube having a closed end and an open end, and having an outer diameter of less than 3 mm;

b) providing a rotor having a central bore with an internal thread for at least a portion of its length the diameter of the central bore being such as to enable the sample tube to be accommodated within the central bore in the said rotor, c) sliding a centring screw over the sample tube, wherein the centring screw has an external thread adapted to engage the said internal thread of the central rotor bore and a central bore adapted to accommodate the sample tube and to centre the sample tube in the central bore of the rotor, d) introducing the sample tube into the said central bore of the rotor and;

e) tightening the centring screw in the central bore of the rotor, wherein a sealing member is provided which is a sliding fit on the sample tube and adapted to form a seal with an internal surface of the central bore of the rotor and with the sample tube, and thereby seal the inner volume of the sample tube in a gas-tight manner, on tightening of the said centring screw, wherein at least prior to tightening of the centring screw, the axial position of the sample tube in the rotor can be adjusted by sliding the sample tube axially in the sample tube.

18. A method as claimed in claim 17, wherein the sealing member is integral with the centring screw.

* * * * *